(12) United States Patent
Tadokoro et al.

(10) Patent No.: US 7,755,274 B2
(45) Date of Patent: Jul. 13, 2010

(54) ORGANIC EL PANEL

(75) Inventors: Toyoyasu Tadokoro, Niigata (JP); Yasuhiro Ikarashi, Niigata (JP)

(73) Assignee: Nippon Seiki Co., Ltd., Niigata (JP)

( * ) Notice: Subject to any disclaimer, the term of this patent is extended or adjusted under 35 U.S.C. 154(b) by 548 days.

(21) Appl. No.: 10/587,401

(22) PCT Filed: Jan. 17, 2005

(86) PCT No.: PCT/JP2005/000453
§ 371 (c)(1), (2), (4) Date: Jul. 27, 2006

(87) PCT Pub. No.: WO2005/074328
PCT Pub. Date: Aug. 11, 2005

(65) Prior Publication Data
US 2007/0145885 A1    Jun. 28, 2007

(30) Foreign Application Priority Data
Jan. 29, 2004    (JP)    ............... 2004-021741

(51) Int. Cl.
  *H01L 51/54* (2006.01)
(52) U.S. Cl. ............... 313/503; 313/506; 428/690
(58) Field of Classification Search ......... 313/498–512; 428/690
See application file for complete search history.

(56) References Cited

U.S. PATENT DOCUMENTS

| | | | |
|---|---|---|---|
| 4,539,507 A | 9/1985 | VanSlyke et al. | |
| 6,387,546 B1 | 5/2002 | Hamada et al. | |
| 6,447,934 B1 * | 9/2002 | Suzuki et al. | 428/690 |
| 6,614,175 B2 * | 9/2003 | Aziz et al. | 313/504 |
| 6,995,736 B2 * | 2/2006 | Eida | 345/76 |
| 2004/0247937 A1 * | 12/2004 | Chen et al. | 428/690 |

FOREIGN PATENT DOCUMENTS

| | | |
|---|---|---|
| JP | 59-194393 | 11/1984 |
| JP | 2002-343571 | 11/2002 |
| JP | 2004-6165 | 1/2004 |
| WO | WO 0167824 A1 * | 9/2001 |

OTHER PUBLICATIONS

Kido, J., et al. "Organic Electroluminescent Devices Based on Molecularly Doped Polymers" Appl. Phys. Lett. Aug. 17, 1992, vol. 61, No. 7, pp. 761-763.

(Continued)

*Primary Examiner*—Nimeshkumar D Patel
*Assistant Examiner*—Anne M Hines
(74) *Attorney, Agent, or Firm*—McDermott Will & Emery LLP

(57) ABSTRACT

An organic EL panel comprises a light-transmitting supporting substrate having formed thereon an organic EL device comprising an organic layer 5 having at least a luminescent layer 5c, sandwiched with a pair of electrodes. The luminescent layer 5c comprises a host material 5f having added thereto a fluorescent material 5g and a transport material (hole transport material) as guest materials.

10 Claims, 3 Drawing Sheets

OTHER PUBLICATIONS

Kido, J., et al. "Single-layer White Light-emitting Organic Electroluminescent Devices Based on Dye-dispersed Poly(N-vinylcarbazole)" Appl. Phys. Lett. Oct. 16, 1995, vol. 67, No. 16, pp. 2281-2283.

Toray Research Center Inc. Chosa Kenkyu Bumon, "Dai 8 Sho Yuki EL Display no Kadai to Kaikesusaku, Yuki EL Display no Honkaku Jitsuyoka Saizensen," Jun. 15, 2002, pp. 257-261 (with English Translatiom).

Tokito, K., et al. "Dai 9 Sho Hole Yusosei Zairyo," Yuki EL Zairyo to Display, Apr. 20, 2001, pp. 142-143 (with English Translation).

* cited by examiner

▲ ORGANIC EL PANEL A
◆ CONVENTIONAL ORGANIC EL PANEL

▲ ORGANIC EL PANEL A
◆ CONVENTIONAL ORGANIC EL PANEL

ORGANIC EL PANEL

RELATED APPLICATION

This application is a national phase of PCT/JP2005/000453 filed on Jan. 17, 2005, which claims priority from Japanese Application No. JP 2004-021741 filed on Jan. 29, 2004, the disclosures of which Applications are incorporated by reference herein. The benefit of the filing and priority dates of the International and Japanese Applications is respectfully requested.

TECHNICAL FIELD

The present invention relates to an organic EL panel comprising a light-transmitting supporting substrate having provided thereon an organic EL (electroluminescence) device comprising an organic layer having at least a luminescent layer, sandwiched with a pair of electrodes.

BACKGROUND ART

As organic EL panels using an organic EL device, a panel in which the organic EL device is formed by successively laminating a first electrode comprising ITO (Indium Tin Oxide) or the like as an anode, an organic layer having at least a luminescent layer, and a non-light-transmitting second electrode comprising aluminum (Al) or the like as a cathode, on a light-transmitting supporting substrate comprising a glass material is known (see, for example, Patent Document 1).

Such an organic EL panel emits light by injecting holes from the first electrode, injecting electrons from the second electrode, and rebonding the holes and electrons in the luminescent layer, and a long-lived panel that emits light with a given luminance over a long period of time is desired.

Patent Document 1: JP-A-59-194393

DISCLOSURE OF THE INVENTION

Problems that the Invention is to Solve

However, in the case that the organic EL panel is driven in a high current density region of 100 A/m$^2$ or more, there were the problems that time until that emission luminance reduces by half is short, and it is difficult to achieve long-life. As shown in FIG. 6, this is considered due to that by that current efficiency showing the bonding efficiency of the holes injected from the first electrode and the electrons injected from the second electrode in a high current density region, the rebonding proportion of the holes and the electrons in the luminescent layer decreases, thereby electrons and holes that do not contribute to emission increase, and by that the electrons and holes that do not contribute to emission accumulate on the interface of an organic material of the organic layer (for example, the interface between the luminescent layer and a hole transport layer), thereby hastening time that the organic material of the organic layer deteriorates.

In view of such a problem, the invention has an object to provide an organic EL panel that enables the life emitting light with a given luminance for a long period of time to prolong, even in the case of driving in a high current density region.

Means for Solving the Problems

To solve the above-mentioned problems, the organic EL panel of the invention is an organic EL panel comprising a light-transmitting supporting substrate having formed thereon an organic EL device comprising an organic layer having at least a luminescent layer, sandwiched with a pair of electrodes, characterized in that the luminescent layer has at least a luminescent layer comprising a host material having added thereto a fluorescent material and a transport material as guest materials.

Further, it is characterized in that the transport material has mobility of the holes or electrons of $10^{-4}$ cm$^2$/V·s or more.

Further, it is characterized in that ionization potential of the fluorescent material is a value lower by 0.1 eV or more than ionization potential of the host material.

Further, it is characterized in that the luminescent layer comprises the host material having hole transport property having added thereto the fluorescent material and the transport material having hole transport property as the guest materials.

Further, it is characterized in that the luminescent layer comprises the host material having electron transport property having added thereto the fluorescent material and the transport material having electron transport property as the guest materials.

Advantage of the Invention

The invention relates to an organic EL panel comprising a light-transmitting supporting substrate having provided thereon an organic EL device comprising an organic layer having at least a luminescent layer, sandwiched with a pair of electrodes, and enables the life that emits light with a given luminance for a long period of time to prolong even in the case of driving in a high density current region.

DESCRIPTION OF REFERENCE NUMERALS AND SIGNS

Figure 1:
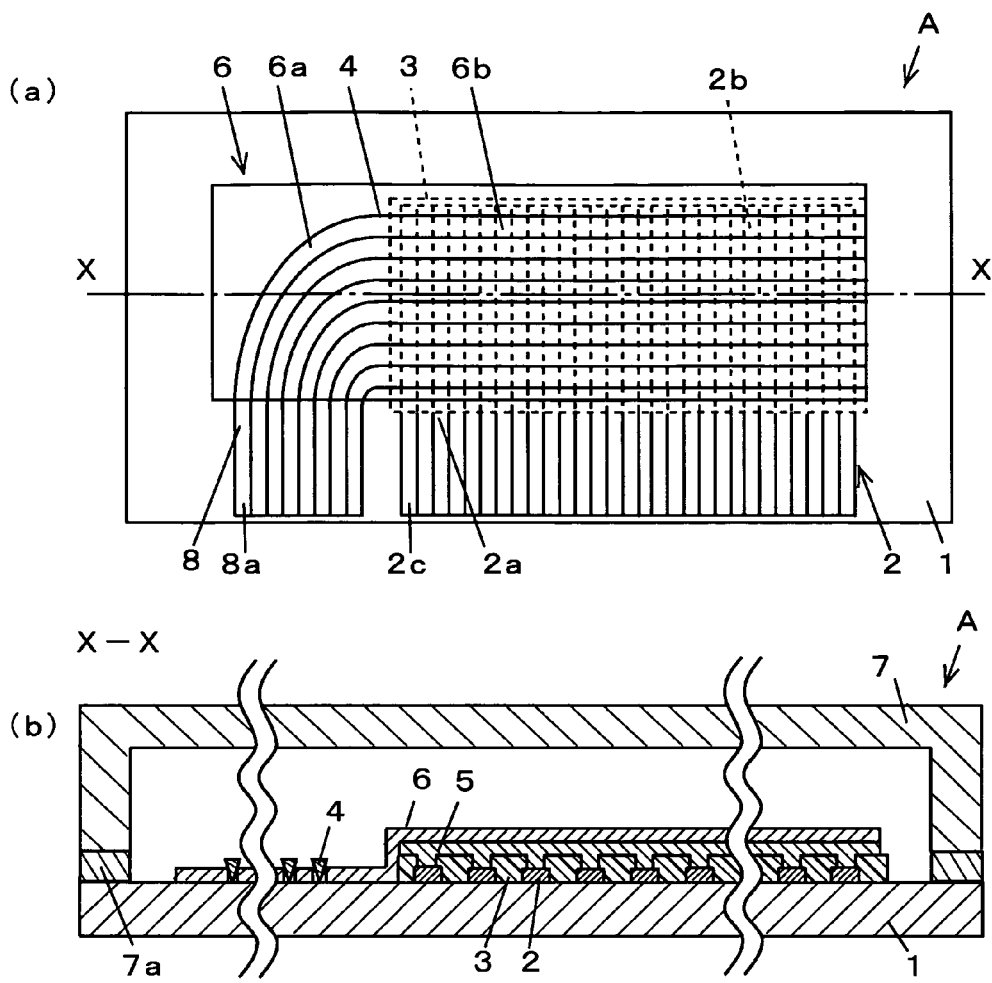
FIG. 1 A view showing an organic EL panel to which the invention was applied.

A Organic EL panel
1 Supporting substrate
2 First electrode
2a Anode wiring part
2b Anode part
2c Anode terminal part
3 Insulating layer
4 Partition wall part
5 Organic layer
5a Hole injection layer
5b Hole transport layer
5c Luminescent layer
5d Electron transport layer
5e Electron injection layer
5f Host material
5g Fluorescent material
5h Hole transport material (transport material)

6 Second electrode
6a Cathode wiring part
6b Cathode part
7 Sealing member
7a Adhesive
8 Connection wiring part
8a Cathode terminal part Best Mode For Carrying Out The Invention The practical embodiment in which the invention was applied to a dot matrix type organic EL panel is described below based on the accompanying drawings.

In FIG. 1, an organic EL panel A is mainly constituted of a supporting substrate 1, a first electrode (anode) 2, an insulating layer 3, a partition wall part 4, an organic layer 5, a second electrode (cathode) 6, and a sealing member 7.

The supporting substrate 1 is a light-transmitting glass substrate having a rectangular shape.

The first electrode 2 is one prepared by forming a light-transmitting conductive material such as ITO (Indium Tin Oxide) on the supporting substrate 1 in a laminar form by a method such as sputtering or deposition, and patterning in a stripe form by, for example, photolithography. The first electrode 2 has an anode wiring part 2a and an anode part 2b as shown in FIG. 1(a), and the anode wiring part 2a is provided with an anode terminal part 2c for electrically connecting to an external electric source, at an end thereof.

The insulating layer 3 comprises an insulating material such as a polyimide type or a phenol type, and is formed on a non-luminescent portion on the supporting substrate 1 in a predetermined form by means such as photolithography. The insulating layer 3 is formed between the anode parts 2a of the first electrode 2, and is also formed so as to slightly overlap with the first electrode 2, thereby insulating between the first electrode 2 and the second electrode described after.

The partition wall part 4 comprises an insulating material such as a phenol type, and its cross section is formed in a reverse-tapered form by means such as photolithography. The partition wall part 4 is formed so as to cross nearly perpendicular to the anode part 2b on the first electrode 2 and the insulating layer 3, and is formed in an arc form viewing from the organic EL device forming surface side of the supporting substrate 1 as shown in FIG. 1(a) on the portion corresponding to the cathode wiring part described after on the supporting substrate 1.

Figure 2:
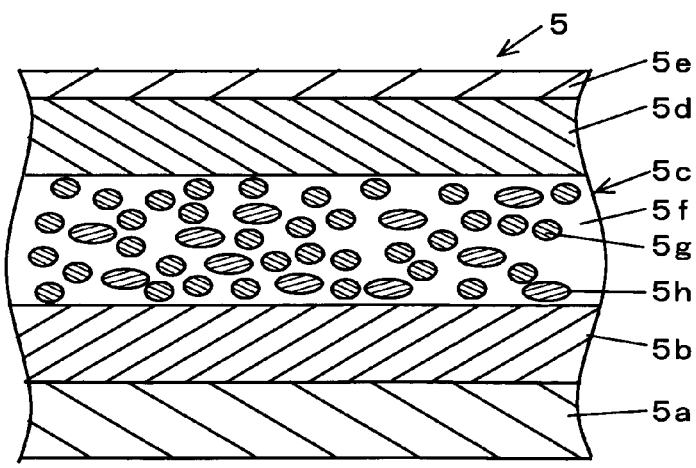
FIG. 2 An enlarged sectional view showing an organic layer of the same as above.

The organic layer 5 is formed on the first electrode 2 and the insulating layer 3, and is formed by successively laminating a hole injection layer 5a, a hole transport layer 5b, a luminescent layer 5c, an electron transport layer 5d and an electron injection layer 5e by means such as deposition method as shown in FIG. 2, thus being a layered form having a film thickness of from 80 to 280 nm.

The hole injection layer 5a has a function to take in holes from the first electrode 2, and comprises, for example, an amine compound formed in a layered form having a film thickness of from 20 to 80 nm by means such as deposition method. Further, the hole injection layer 5a is that a glass transition temperature is 85° C. or higher (further preferably 100° C. or higher).

The hole transport layer 5b has a function to convey the holes to the luminescent layer 5c, and comprises, for example, a triphenyl amine tetramer which is an amine compound, formed in a layered form having a film thickness of from 10 to 60 nm by means such as deposition method. Further, the hole transport layer 5b is that a glass transition temperature is 85° C. or higher (further preferably 100° C. or higher).

The luminescent layer 5c comprises a fluorescent material 5g and a hole transport material (transport material) 5h as guest materials doped in a host material 5f by means such as co-deposition method, and formed in a layered form having a film thickness of from 20 to 60 nm, as shown in FIG. 2c. The host material 5f can transport holes and electrons, has a function to show emission by transporting the holes and electrons and rebonding, has also the characteristics of hole mobility that hole mobility is high and electron mobility is low, and comprises, for example, distyryl arylene derivatives. Further, the host material 5f is that a glass transition temperature is 85° C. or higher (further preferably 100° C. or higher). The fluorescent material 5g has a function to emit light by reacting to the rebonding of electrons and holes, shows emission of an amber color (orange color), and comprises, for example, Model RD001, a product of Idemitsu Kosan Co., Ltd. It is desirable that doping amount of the fluorescent material 5g is constituted to be in an extent such that concentration quenching does not occur, and in the present practical embodiment, the fluorescent material 5g is added such that concentration in the luminescent layer 5c is from 2 to 8%. Further, ionization potential Ipd of the fluorescent material 5g is a value lower by 0.1 eV or more than ionization potential Iph of the host material 5f (Iph−Ipd$\geqq$0.1 eV). The hole transport material 5h comprises, for example, TPTE of a triphenylamine tetramer which is an amine compound, and has the characteristics of hole transport property that hole mobility is high and electron mobility is low, and the hole mobility is $10^{-4}$ cm$^2$/V·s or more. Further, the hole transport material 5h is added such that concentration in the luminescent layer 5c is from 5 to 20%. Further, the hole transport material 5h is that a glass transition temperature is 85° C. or higher (further preferably 100° C. or higher).

The electron transport layer 5d has a function to convey electrons to the luminescent layer 5c, and comprises, for example, aluminum quinolinol (Alq3) which is a chelate compound, formed in a layered form having a film thickness of from 20 to 60 nm by deposition method or the like.

The electron injection layer 5e has a function to inject electrons from the second electrode 6, and comprises, for example, lithium fluoride (LiF) formed in a layered form having a film thickness of about 1 nm by means such as deposition method.

The second electrode 6 comprises a conductive material such as aluminum (Al) or magnesium silver (Mg:Ag) formed in a layered form having a film thickness of from 50 to 200 nm by means such as deposition method, and is partitioned in a stripe form by the partition wall part 4, and the cathode part 6b that crosses nearly perpendicular to the arc-shaped cathode wiring part 6a and the transparent electrode 2 is formed (see FIG. 1(a)). Further, the cathode wiring part 6a is electrically connected to a connection wiring part 8. The connection wiring part 8a is formed together with the first electrode 2, and comprises the same material of ITO. Further, the connection wiring part 8 has a cathode terminal part 8a formed at the end part, for electrically connecting to an external electric source.

As above, the organic EL device on which pixels comprising the corresponding portions of the anode part 2b and the cathode part 6b are provided in matrix form is obtained by successively laminating the first electrode 2, the insulating layer 3, the partition wall part 4, the organic layer 5 and the second electrode 6 on the supporting substrate 1.

The sealing member 7 comprises a flat plate member comprising, for example, a glass material, formed in a concave form by an appropriate method such as sandblast, cutting or etching. The sealing member 7 seals the organic EL device with the sealing member 7 and the supporting substrate 1 by air-tightly providing on the supporting substrate 1 through an adhesive 7a comprising, for example, an ultraviolet curing epoxy resin. The sealing member 7 is constituted to be slightly smaller than the supporting substrate 1 such that the anode terminal part 2c of the first electrode 2 and the cathode terminal part 8a connected to the second electrode 6 are exposed outwardly. The sealing member may be a flat plate form, and in this case, the sealing member is provided on the supporting substrate through a spacer.

Figure 3:
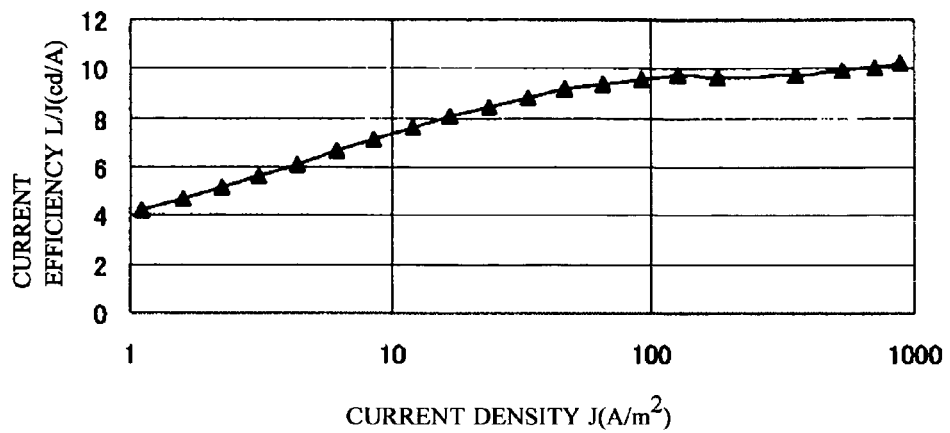
FIG. 3 A view showing current efficiency of the organic EL panel of the same as above.
Figure 4:
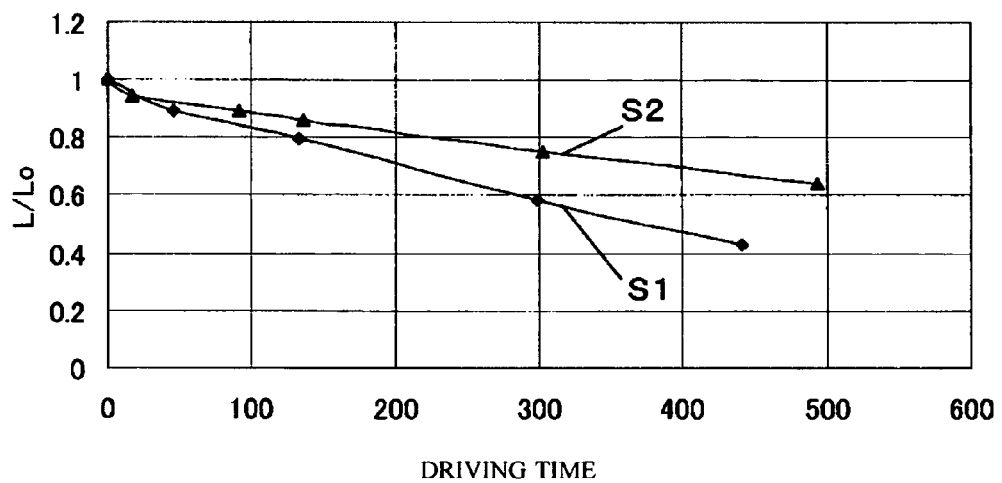
FIG. 4 A view showing the relationship between emission time and emission luminance in the organic EL panel of the same as above and the conventional organic EL panel.
Figure 5:
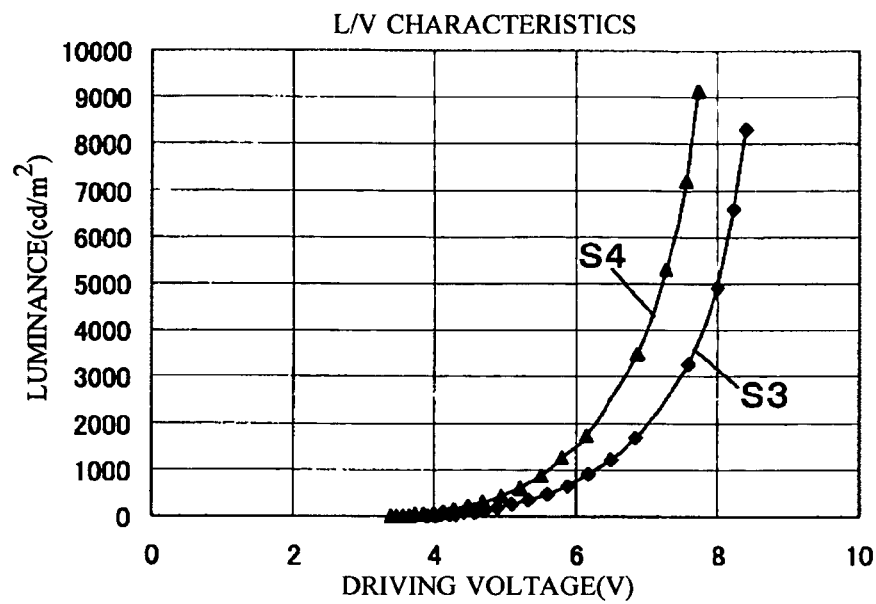
FIG. 5 A view showing the relationship between driving voltage and emission luminance in the organic EL panel of the same as above and the conventional organic EL panel.
Figure 6:
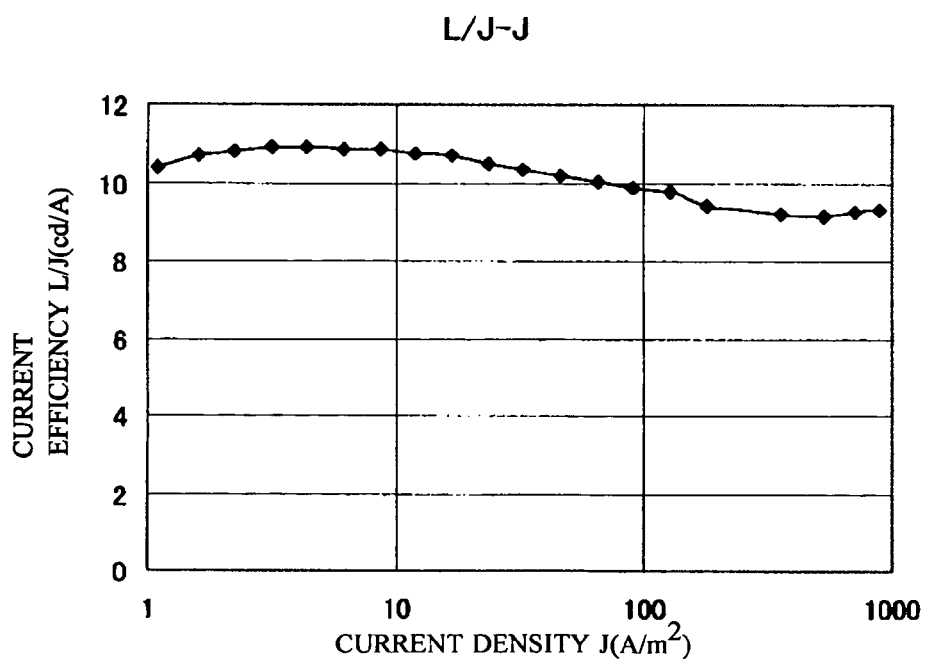
FIG. 6 A view showing current efficiency of the conventional organic EL panel.

As above, a dot matrix type organic EL panel A is obtained, which has, as a display part, the organic EL device having pixels comprising the corresponding portions of the anode part 2b and the cathode part 6b provided in matrix form. This organic EL panel A obtains emission of amber color by rebonding the holes from the first electrode 2 and the electrons from the second electrode 6 in the luminescent layer 5c. Further, the organic EL panel drives by a so-called passive drive by selecting each of the plural anode parts 2b and the plural cathode parts 6b, respectively, formed in a stripe form, applying constant electric current, and flashing the pixels comprising the corresponding portions of the selected anode part 2a and the cathode part 6b. In the conventional organic EL panel, in the case of driving in a high current density region as described before, the efficiency (current efficiency) of the rebonding of holes and electrons decreases, and holes and electrons, not contributing to emission increase, resulting in accelerating deterioration of an organic material of an organic layer. However, in the organic EL panel A of the present practical embodiment, because the luminescent layer 5c has the host material 5f having hole transport property and the hole transport material 5h, the hole mobility is higher than the luminescent layer of the conventional organic EL panel, and as shown in FIG. 3, in the case of driving at a high current density region, it is possible to obtain the characteristics that the current efficiency is a value approximating the maximum value or the minimum value. That is, the organic EL panel A has high proportion of rebonding between holes and electron in driving in a high current density region. From this, even in the case of driving in a high current density region, holes and electrons, not contributing to emission are smaller than the conventional organic EL panel, and deterioration of an organic material of the organic layer 5 is suppressed. As a result, decrease of emission luminance in the luminescent layer 5c with the passage of time can be suppressed. FIG. 4 is the experimental result showing change of emission luminance with the passage of emission time in the case of driving an organic EL panel provided with an organic EL device having the conventional luminescent layer of the same emission area, and the organic EL panel A provided with the organic EL device having the luminescent layer 5c of the present practical embodiment in high temperature environment of 85° C. and a high current density region of 300 A/M². Characteristic S1 shows characteristics of the conventional organic EL panel, and characteristic S2 shows characteristics of the organic EL panel A of the present practical embodiment. It is apparent from FIG. 4 that in the organic EL panel A, the initial luminance is equal to the conventional organic EL panel, and decrease of emission luminance with the passage of emission time is suppressed as compared with the conventional organic EL panel, and therefore, the organic EL panel A of the present practical embodiment is superior to the conventional organic EL panel. Further, FIG. 5 is the experimental result showing change of emission luminance in the case of applying a predetermined driving voltage to the above-described conventional organic EL panel and organic EL panel A. Characteristic S3 shows the characteristics of the conventional organic EL panel, and characteristic S4 shows the characteristics of the organic EL panel A. When applying the same driving voltage, the organic EL panel A is capable of driving with emission luminance higher than the conventional organic EL panel. That is, the organic EL panel A can obtain a predetermined emission luminance at low voltage as compared with the conventional organic EL panel. This makes it possible to reduce load to the organic layer 5, and enables deterioration of an organic material of the organic layer 5 to suppress.

The organic EL panel A is that the organic layer 5 sandwiched with the first electrode 2 and the second electrode 6 has al least the luminescent layer 5c comprising the host material 5f having hole transport property having doped therein, the fluorescent material 5g and the hole transport material 5h. Further, the luminescent layer 5c comprises the host material 5f having doped therein the hole transport material 5h having hole mobility of $10^{-4}$ m²/V·s or more. Further, the luminescent layer 5c is that ionization potential Ipd of the fluorescent material 5g added is a value 0.1 eV lower than ionization potential Iph of the host material 5f. From the above constitution, by improving the efficiency of rebonding of holes and electrons when driving in a current density region high than the conventional organic EL panel, the organic EL panel A decreases holes and electrons, not contributing to emission, thereby suppressing deterioration of an organic material of the organic layer 5, and enables the life to prolong so as to emit with a predetermined luminance for a long period of time. Further, the organic EL panel A can obtain a predetermined emission luminance at low voltage as compared with the conventional organic EL panel, and therefore can reduce load to the organic layer 5, making it possible to suppress deterioration of an organic material of the organic layer 5.

The present practical embodiment is directed to a dot matrix type organic EL panel A, but the invention is applicable to a segment type organic EL panel.

Further, the organic EL panel A of the present practical embodiment is a constitution having the luminescent layer 5c comprising the host material 5f having hole transport property having doped therein the fluorescent material 5g and the hole transport material 5h, but in the invention, the same effect is obtained in a luminescent layer comprising a host material having electron transport property having doped therein a fluorescent material and a transport material having electron transport property.

Further, in the organic EL panel A of the present practical embodiment, the luminescent layer 5c comprises the host material 5f having doped therein the fluorescent material 5g emitting in amber color, but in the invention, the fluorescent material doped in the host material may be a material emitting in other emitting color.

INDUSTRIAL APPLICABILITY

The invention is applied to an organic EL panel comprising a light-transmitting supporting substrate having provided thereon an organic EL device comprising an organic layer having at least a luminescent layer, sandwiched with a pair of electrodes.

The invention claimed is:

1. An organic EL (electroluminescence) panel comprising a light-transmitting supporting substrate having formed thereon an organic EL device comprising an organic layer having at least a luminescent layer, sandwiched with a pair of electrodes, wherein the luminescent layer comprises a host material having added thereto a fluorescent material and a transport material as guest materials, and wherein the host material of the luminescent layer comprises distyryl arylene or derivatives thereof, and glass transition temperature of the host material is 85° C. or higher.

2. The organic EL panel as claimed in claim 1, wherein the transport material has mobility of holes or electrons of $10^{-4}$ cm$^2$/V·s or more.

3. The organic EL panel as claimed in claim 1, wherein ionization potential of the fluorescent material is a value lower by 0.1 eV or more than ionization potential of the host material.

4. The organic EL panel as claimed in any one of claims 1 to 3, wherein the luminescent layer comprises the host material having electron transport property, having added thereto the fluorescent material and the transport material having electron transport property, as the guest materials.

5. The organic EL panel as claimed in any one of claims 1 to 3, wherein the luminescent layer comprises the host material having hole transport property, having added thereto the fluorescent material and the transport material having hole transport property, as the guest materials.

6. An organic EL device, comprising:
a hole injection layer;
a hole transport layer;
a luminescent layer;
an electron transport layer; and
an electron injection layer,
wherein the hole injection layer, the hole transport layer, the luminescent layer, the electron transport layer and the electron injection layer are stacked in this order, the luminescent layer comprises a host material and guest materials including a fluorescent material and a transport material, and the host material of the luminescent layer comprises distyryl arylene or derivatives thereof, and glass transition temperature of the host material is 85° C. or higher.

7. The organic EL device as claimed in claim 6, wherein the transport material has mobility of holes or electrons of $10^{-4}$ cm$^2$V·s or more.

8. The organic EL device as claimed in claim 6, wherein ionization potential of the fluorescent material is a value lower by 0.1 eV or more than ionization potential of the host material.

9. The organic EL device as claimed in claim 6, wherein the host material has hole transport property, and the transport material has hole transport property.

10. The organic EL device as claimed in claim 6, wherein the host material has electron transport property, and transport material has electron transport property.

* * * * *